United States Patent
Szeles et al.

(10) Patent No.: US 7,192,481 B2
(45) Date of Patent: Mar. 20, 2007

(54) RADIATION DETECTOR

(75) Inventors: Csaba Szeles, Allison Park, PA (US); Kelvin G. Lynn, Pullman, WA (US)

(73) Assignee: II-VI Incorporated, Saxonburg, PA (US)

( * ) Notice: Subject to any disclaimer, the term of this patent is extended or adjusted under 35 U.S.C. 154(b) by 0 days.

(21) Appl. No.: 10/516,799

(22) PCT Filed: Jun. 10, 2003

(86) PCT No.: PCT/US03/18225

§ 371 (c)(1),
(2), (4) Date: Jul. 27, 2005

(87) PCT Pub. No.: WO03/105197

PCT Pub. Date: Dec. 18, 2003

(65) Prior Publication Data

US 2005/0268841 A1    Dec. 8, 2005

(51) Int. Cl.
*C30B 28/08* (2006.01)
(52) U.S. Cl. .......................... 117/45; 117/43
(58) Field of Classification Search .................. 117/43, 117/45

See application file for complete search history.

(56) References Cited

U.S. PATENT DOCUMENTS

| | | |
|---|---|---|
| 3,718,511 A | 2/1973 | Moulin |
| 4,190,486 A | 2/1980 | Kyle |
| 4,566,918 A | 1/1986 | Irvine et al. |
| 5,861,321 A | 1/1999 | Tregilgas et al. |

OTHER PUBLICATIONS

Avella et al., "Uniformity and Physical Properties of Semi-Insulating Fe-doped InP After Wafer and Ingot Annealing", Journal of Applied Physics, 1997, pp. 3836-3845, vol. 82. No. 8, USA.
McGregor, et al., "Gallium Arsenide Radiation Detectors and Spectrometers", Semiconductors and Semimetals, 1995, p. 383, vol. 43.
Papastamatiou et al., "Recombination Mechanism and Carrier Lifetimes of Semi-Insulating GAAS-CR", Journal of Applied Physics, 1990, pp. 1094-1098, vol. 68 No. 3, USA.
Marfaing, Y., "Models of Donor Impurity Compensation in Cadmium Telluride", Revue de Physique Appliquee, Feb. 1977, pp. 211-217, vol. 12 No. 2, France.
Chern et al., "The Defect Structure of CdTe: Hall Data", Journal of Solid State Chemistry, May 1975, pp. 33-43, vol. 14 No. 1, USA.
Siffert et al., "Cadmium Telluride Nuclear Radiation Detectors", IEEE Transactions on Nuclear Science, Feb. 1975, pp. 211-225, vol. 22 No. 1, USA.

*Primary Examiner*—Felisa Hiteshew
(74) *Attorney, Agent, or Firm*—The Webb Law Firm

(57) ABSTRACT

A radiation detector made from a compound, or alloy, comprising $Cd_xZn_{1-x}Te$ ($0=x=1$), Pb in a concentration between 10 and 10,000 atomic parts per billion and at least one element selected from the group consisting of (i) Cl and (ii) elements in column III of the periodic table in a concentration between 10 and 10,000 atomic parts per billion. The radiation detector exhibits full electrical compensation, high-resistivity, full depletion under an applied electrical bias and excellent charge transport.

11 Claims, 1 Drawing Sheet

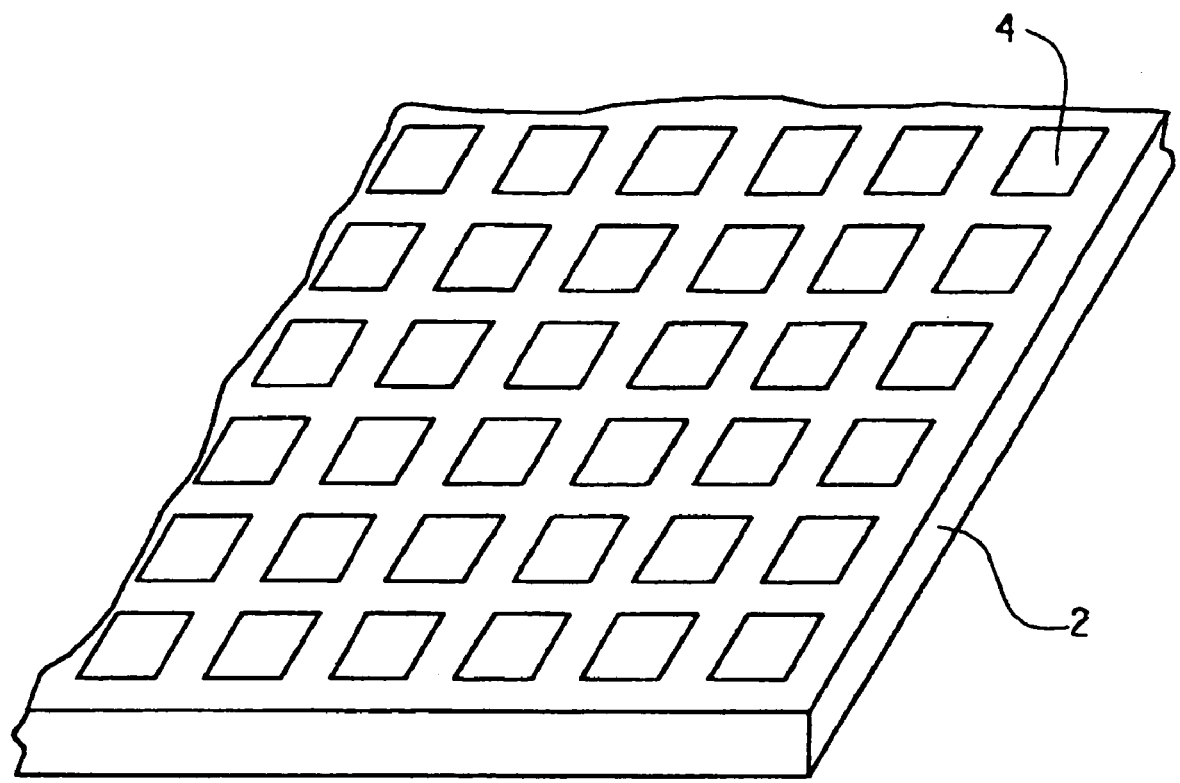

RADIATION DETECTOR

BACKGROUND OF THE INVENTION

1. Field of the Invention

The present invention relates to radiation detectors and a method of making the same. More specifically, the present invention is a fundamentally new approach for growing semi-insulating $Cd_xZn_{1-x}Te$ (0#x #1) crystals with full active volume for detecting radiation in the 1 keV–5 MeV photon energy range.

2. Description of Related Art

Fundamental physical properties govern the selection of material for all radiation detector applications. Firstly, the material must exhibit high electrical resistivity. Secondly, the material must exhibit an excellent transport of the charge carriers generated by external radiation. Lastly, the material must allow an applied electric field to extend through the whole volume of the crystal, i.e., full depletion. None of these properties is exhibited in high-purity, intrinsic or undoped Cadmium Telluride, Zinc Telluride or Cadmium Zinc Telluride, i.e., $Cd_xZn_{1-x}Te$ ($0 \leq x \leq 1$), grown by any known method.

High-purity intrinsic $Cd_xZn_{1-x}Te$ ($0 \leq x \leq 1$) typically has low electrical resistivity due to the formation of a large density of intrinsic or native defects, notably cadmium (Cd) vacancies in tellurium (Te) rich growth conditions or Cd interstitials in Cd rich growth conditions. In addition, an intrinsic defect of unknown origin with a deep level at the middle of the band gap is formed in large concentrations. This intrinsic defect has electronic properties that do not permit full depletion of the device when the defect is present in large concentrations.

High resistivity $Cd_xZn_{1-x}Te$ ($0 \leq x \leq 1$) is typically obtained by doping with column III elements, e.g., In, Al and Ga, in a vertical or horizontal. Bridgman process or with column VII elements, e.g., Cl, in the travelling heater method. In these processes, however, significant concentrations of dopants are typically introduced that lead to diminished carrier transport and secondary effects, such as polarization of the detectors. This latter phenomenon refers to the reduction of the effective volume, i.e., efficiency, due to the collapse of the internal electric field due to carrier trapping caused by the introduced dopants or other defects. With the foregoing doping scheme it is also difficult to technologically control the achieved resistivity due to incomplete electrical compensation. As a result, electrical resistivity variation in the $1 \times 10^6$–$1 \times 10^9$ Ohm-cm range is typically observed.

Electrical compensation by dopants introducing energy levels to the middle of the band gap is often used in column III-V compounds to obtain semi-insulating material. However, none of these doping schemes have solved the problem of passivating intrinsic defects forming in these materials. Examples include, but are not limited to, iron (Fe) doping in indium-phosphide (InP) and chromium (Cr) doping in gallium arsenide (GaAs). The intrinsic defect was identified as a native defect EL2 in gallium arsenide (GaAs). The addition of a single doping element with a deep level in the middle of the band gap in high concentration introduces a strong trapping of charge carriers produced by external radiation and does not passivate the intrinsic deep level that causes incomplete depletion of the devices. As a result, radiation detectors fabricated from so produced semi-insulating column III-V compounds, e.g., GaAs, are hampered by low resistivity and limited active depletion regions and do not allow for passivation of the intrinsic defects.

Incorporation of unknown impurities and the formation of native defects can render intrinsic $Cd_xZn_{1-x}Te$ ($0 \leq x \leq 1$) highly-resistive. However, such material typically exhibits strong carrier trapping whereupon the performance of the radiation detector is compromised. When impurities, native defects and their associations are incorporated in an uncontrolled manner the properties of the $Cd_xZn_{1-x}Te$ ($0 \leq x \leq 1$) ingots vary from growth to growth and exhibit strong spatial variation within individual ingots.

Accordingly, what is needed is a radiation detector made from an compound, or alloy, which has excellent carrier transport properties and which fully depletes in response to an applied electric field. What is also needed is a method of forming such an compound, or alloy.

SUMMARY OF THE INVENTION

The invention is a radiation detector made from an compound, or alloy, comprising: $Cd_xZn_{1-x}Te$, where $0 \leq x \leq 1$; Pb in a concentration between 10 and 10,000 atomic parts per billion; and at least one element selected from the group consisting of (i) Cl or (ii) elements from column III of the periodic table in a concentration between 10 and 10,000 atomic parts per billion.

The compound, or alloy, can further include an element selected from the group consisting of V, Ti, Ni, Sn and Ge in a concentration between 10 and 10,000 atomic parts per billion.

The invention is also a method of forming a radiation detector compound, or alloy, comprising: (a) providing a mixture of Cd, Zn and Te; (b) heating the mixture of Cd, Zn and Te to a liquid state; (c) adding to the liquid mixture a first dopant that adds shallow level donors, i.e., electrons, to the top of an energy band gap of said mixture when it is solidified; (d) adding to the liquid mixture a second dopant that adds deep level donors and/or acceptors to the middle of said band gap of said mixture when it is solidified; and (e) solidifying said mixture including said first and second dopants to form the compound, or alloy.

The first dopant is at lest one element selected from one of column III and column VII of the periodic table. More specifically, the first dopant can be at least one element selected from the group consisting of B, Al, Ga, In, Tl and Cl. The concentration of the first dopant in the compound, or alloy, can be between 10 and 10,000 atomic parts per billion.

The second dopant can be Pb having a concentration in the compound, or alloy, between 10 and 10,000 atomic parts per billion.

The invention can also include adding to the mixture a third dopant that adds deep level donors and/or acceptors to the middle of said band gap of said mixture when it is solidified. The third dopant can be at least one element selected from the group consisting of V, Ti, Ni, Sn and Ge. The concentration of the third dopant in the compound, or alloy, can be between 10 and 10,000 atomic parts per billion.

BRIEF DESCRIPTION OF THE DRAWING

The single FIGURE is a perspective view of a crystal wafer including a plurality of picture elements or pixels formed into a pixilated array.

DETAILED DESCRIPTION OF THE INVENTION

In accordance with the present invention, specific combinations of specific elements are introduced into $Cd_xZn_{1-}$ $_x$Te (0≦x≦1) in a controlled way in quantities appropriate to the growth method to reliably produce useful extrinsic or doped Cd$_x$Zn$_{1-x}$Te (0≦x≦1) with high resistivity (semi-insulating) and excellent carrier transport properties that fully depletes under applied bias. In the process (referred to as "co-doping" or "tri-doping"), at least two and possibly three different additives or dopants are deliberately chosen and incorporated to the Cd$_x$Zn$_{1-x}$Te (0≦x≦1) crystals during the crystal growth process.

In the co-doping scheme, a first dopant formed from at least one element from column III of the periodic table, namely, boron (B), aluminum (Al), gallium (Ga), indium (In), thallium (Tl) or column VII of the periodic table, namely, chlorine (Cl) is introduced in the 10 atomic parts per billion (ppb) to 10,000 atomic parts per billion concentration range (10–10,000 at ppb) along with a second dopant, namely, lead (Pb), in the 10 atomic parts per billion (ppb) to 10,000 atomic parts per billion concentration range (10–10,000 at ppb). To gain additional control of the material properties, a tri-doping scheme is applied utilizing the first and second dopants described above along with a third dopant formed from at least one element chosen from the group of vanadium (V), titanium (Ti), nickel (Ni), tin (Sn) or germanium (Ge) in the 10 atomic parts per billion (ppb) to 10,000 atomic parts per billion concentration range (10–10,000 at ppb) to pin or set the Fermi level. Desirably, the first dopant is formed from one element from column III or column VII of the periodic table and the third dopant is formed from one element chosen from the group of vanadium (V), titanium (Ti), nickel (Ni), tin (Sn) or germanium (Ge). However, this is not to be construed as limiting the invention.

The resulting Cd$_x$Zn$_{1-x}$Te (0≦x≦1) crystals are referred to as doped by X-Y or X-Y-Z where X equals any of the elements B, Al, Ga, In or Cl, and Y is the element Pb, i.e., co-doping process by B—Pb, Al—Pb, Ga—Pb, In—Pb, Tl—Pb, Cl—Pb, etc. Lead (Pb) is chosen to complex and passivate the intrinsic deep level that does not allow full depletion of the fabricated Cd$_x$Zn$_{1-x}$Te (0≦x≦1) detector devices. When these elements are added in sufficient quantities they passivate the intrinsic deep level and introduce a deep level that pins or sets the Fermi level at the middle of the band gap to achieve a high resistivity compound or alloy. Depending on the chosen crystal growth method and the applied growth conditions, the doping element lead (Pb) does not always produce deep levels in quantities required to achieve full electrical compensation. In this case, the addition of the third element Z chosen from any of the elements V, Ti, Ni, Sn or Ge is required to provide a deep level to pin the Fermi level at the middle of the band gap and achieve a material that exhibits the properties of full electrical compensation and high-resistivity.

The described doping technique works on the principle of electrical compensation. Intrinsic or undoped Cd$_x$Zn$_{1-x}$Te (0≦x≦1) varies in resistivity due to doping by the uncontrolled amount of residual impurities and native defects such as cadmium vacancies, dislocations and an intrinsic deep level defect incorporated to the material during crystal growth. Some of these crystal defects are ionized at ambient temperature and can provide an ample supply of free charge carriers, e.g., electrons or holes, resulting in low-resistivity Cd$_x$Zn$_{1-x}$Te (0≦x≦1) or high resistivity material that does not have the properties needed for radiation detector applications. Formation of deep levels from intrinsic or native defects in sufficient concentration during crystal growth can produce crystals of high resistivity. However these crystals cannot be fully depleted by external bias. Heretofore, this issue has not been solved and no methods have been disclosed regarding how to effectively passivate this intrinsic deep level and achieve fully depleting crystals under external bias conditions. The concentration of free charge carriers in these undoped crystals is typically proportional to the concentration difference of donor and acceptor defects. Certain defects also strongly trap the charge carriers generated by the external radiation limiting their transport, efficiency and the use of the material in radiation detector devices.

In intrinsic Cd$_x$Zn$_{1-x}$Te (0≦x≦1), the concentration of cadmium vacancies, i.e., vacant lattice sites, dislocations and intrinsic defects with deep levels (possibly associated with Te anti-site complexes) vary arbitrarily and depend strongly on the applied growth method and temperature program. Such a strong variation of the concentration of the dominant native defects that control the properties of Cd$_x$Zn$_{1-x}$Te (0≦x≦1) on the growth and post-growth processing conditions render the material unusable for radiation detectors. The typical electrical resistivity of intrinsic Cd$_x$Zn$_{1-x}$Te (0≦x≦1) can vary by 5 orders of magnitude from the maximum resistivity, ≧1×10$^{10}$ Ohm-cm, achievable in this material. The maximum achievable resistivity of the Cd$_x$Zn$_{1-x}$Te (0≦x≦1) depends on the electronic structure, i.e., band gap, and is a function of the composition, i.e., cadmium to zinc ratio, of the material. Defects and impurities that produce free holes and electrons are referred as acceptors and donors, respectively.

By the deliberate introduction of chosen elements that produce charge carriers of the opposite sign, the phenomenon of electrical compensation can be achieved. As a result, the concentration of free charge carriers can be made proportional to the difference of the concentrations of acceptor and donor defects. In Cd$_x$Zn$_{1-x}$Te (0≦x≦1), any one or combination of the column III impurities (B, Al, Ga, In, Tl) and/or column VII impurity Cl can serve as donors that compensate for the effect of acceptors such as cadmium vacancies and can form complexes with these defects. The net carrier concentration equals the difference of the concentration of the column III impurity and/or the column VII impurity Cl and the concentration of the cadmium vacancies complexes. In this process, the net carrier concentration is typically reduced by 2 to 6 orders of magnitude. It is, however, difficult to precisely and reliably control the exact concentration of acceptor and donor defects and to achieve a fully compensated, i.e., high resistivity ≧1×10$^{10}$ Ohm-cm, material. Complete electrical compensation where the net carrier concentration is reduced below 1×10$^7$ cm$^{-3}$ is well beyond present-day crystal growth capabilities using direct compensation between shallow donors and acceptors employing a single-element doping scheme. In addition, the well-known and published doping recipes using only one column III or column VII element does not change the electrical activity of the intrinsic deep levels. Cd$_x$Zn$_{1-x}$Te (0≦x≦1) materials produced a single element doping cannot be fully depleted by the application of high bias voltage if the detector crystal thickness exceeds 1 mm. Typically, resistivity in the 1×10$^6$–1×10$^9$ Ohm-cm range is achieved by column III or column VII impurity doping in Cd$_x$Zn$_{1-x}$Te (0≦x≦1). However, this process does not produce satisfactory radiation detector performance, which is associated with the presence of deep level intrinsic defects. The commercial success of radiation detectors is limited as high-efficiency, e.g., thicker than 1 mm, detectors cannot be fabricated from these crystals. By the introduction of carefully chosen doping elements in accordance with the present invention, these doping elements can complex with the intrinsic deep level whereupon the detrimental effect of the intrinsic defects can be reduced or eliminated.

In accordance with the present invention, a second dopant and, if required by the growth conditions, a third doping dopant is introduced in addition to the first dopant formed from column III and/or column VII impurities during the growth process of $Cd_xZn_{1-x}Te$ ($0 \leq x \leq 1$) to achieve a full electrical compensation, high-resistivity or semi-insulating material that shows full depletion and excellent charge transport. By the introduction of the second dopant, i.e., lead (Pb), in combination with the first dopant formed from column III and/or column VII elements, the depletion properties of the detector as well as control of the electrical resistivity of $Cd_xZn_{1-x}Te$ ($0 \leq x \leq 1$) material can be controlled and a fully compensated material obtained. The second dopant Pb passivates the intrinsic deep level and introduces sufficient amounts of deep levels to the middle of the band gap to achieve fully compensated high-resistivity $Cd_xZn_{1-x}Te$ ($0 \leq x \leq 1$).

Under certain growth conditions, full electrical compensation cannot be achieved with the X-Y, co-doping scheme. In this case, the third dopant formed from one or more elements chosen from the group of V, Ti, Ni, Sn or Ge is included to control the resistivity after passivating the intrinsic deep level, that limits full depletion. After passivating the intrinsic deep level with the addition of Pb, the third dopant, having levels close to the middle of the band gap (these are called deep level dopants or deep donors and acceptors), is added. With this procedure, semi-insulating $Cd_xZn_{1-x}Te$ ($0 \leq x \leq 1$) with electrical resistivity exceeding $1 \times 10^{10}$ Ohm-cm is reliably and reproducibly achieved. In this process, the third, deep level dopant electrically compensates the residual net charge carriers given by the difference of the concentrations of acceptors, i.e., cadmium vacancies, cadmium vacancy-column III impurity pairs, column I impurities positioned at cadmium or zinc sites, column V impurities positioned at tellurium sites, and donors, i.e., column III impurities on cadmium or zinc sites. As a result, fully compensated $Cd_xZn_{1-x}Te$ ($0 \leq x \leq 1$) with resistivity at the theoretical maximum value is reliably achieved.

In addition to electrically compensating the acceptors, i.e., cadmium vacancies and/or deep levels, column III impurities also combine with the cadmium vacancies to form impurity-vacancy pairs commonly known and referred to as A-centers. In this process, the energy level of the cadmium vacancy defect is shifted to the lower energy level of the A center. The lower energy of the new defect, i.e., A center, reduces the residency time of charge carriers or holes at the defect and improves the transport properties of carriers generated by the external radiation. As a result, the performance of radiation detectors fabricated from the doped, $Cd_xZn_{1-x}Te$ ($0 \leq x \leq 1$) crystals are greatly improved.

The unique feature of the using two dopants in parallel, i.e., co-doping, or three dopants in parallel, i.e., tri-doping, is that it enables the use of low concentrations of individual dopants and, hence, dopant elements, to achieve full compensation and excellent charge transport in $Cd_xZn_{1-x}Te$ ($0 \leq x \leq 1$) crystals. In tri-doping, the first dopant is one or more elements from column III and/or column VII that provides donors and makes A-centers, the second dopant passivates the intrinsic deep level enabling full depletion of the devices and the third dopant is a deep level that secures full electrical compensation and, hence, controls the resistivity. This eliminates the adverse effects of the commonly used single doping schemes on the carrier transport properties of $Cd_xZn_{1-x}Te$ ($0 \leq x \leq 1$) through the use of massive concentrations of a compensating doping element. The high concentration of a dopant in the single-dopant scheme masks the effects of the intrinsic deep level and does not passivate the intrinsic deep level causing incomplete depletion of the detectors and space charge build up during operation of the device and the collapse of the internal electric field in the radiation detector commonly called as polarization.

The co-doped or tri-doped semi-insulating $Cd_xZn_{1-x}Te$ ($0 \leq x \leq 1$) crystals discussed above can be grown from, without limitation, melt by high-pressure Bridgman, horizontal Bridgman with or without Cd partial pressure control, vertical Bridgman with or without Cd partial pressure control, vapor phase transport, vertical or horizontal gradient freeze with or without cadmium partial pressure control, vertical or horizontal electro-dynamic gradient with or without Cd partial pressure control.

With reference to FIG. 1, once a $Cd_xZn_{1-x}Te$ ($0 \# x \# 1$) crystal including the co-doping or tri-doping scheme discussed above has been formed into an ingot, a slice or wafer 2 of the crystal is removed therefrom. Wafer 2 can then be formed into a pixilated array where each picture element or pixel 4 is capable of converting incident radiation, such as x-rays and gamma rays, or incident particles, such as alpha or beta particles, into an electrical signal independent of each other pixel 4 of the array. Alternatively, wafer 2 can be a crystal that outputs an electrical signal in response to incident radiation or an incident particle, but which does not include a plurality of individual pixels 4. An example of wafer 2 including a single pixel 4 isolated from the reminder of wafer 2 is shown in FIG. 1. However, this is not to be construed as limiting the invention since a planar crystal can be formed in any desired and manufacturable size and shape.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof

The invention claimed is:

1. A method of forming a radiation detector compound comprising:
   (a) providing a mixture of Cd, Zn and Te;
   (b) heating the mixture to a liquid state;
   (c) adding to the liquid mixture a first dopant that adds shallow level donors (electrons) to the top of an energy band gap of said mixture when it is solidified;
   (d) adding to the liquid mixture a second dopant that adds deep level donors and/or acceptors to the middle of said band gap of said mixture when it is solidified; and
   (e) solidifying said mixture including said first and second dopants to form the compound.

2. The method of claim 1, wherein the first dopant is at least one element from column III and/or column VII of the periodic table.

3. The method of claim 2, wherein the first dopant is at least one element selected from the group consisting of B, Al, Ga, In, Tl and Cl.

4. The method of claim 1, wherein a concentration of the first dopant in the compound is between 10 and 10,000 atomic parts per billion.

5. The method of claim 1, wherein the second dopant is Pb.

6. The method of claim 1, wherein a concentration of the second dopant in the compound is between 10 and 10,000 atomic parts per billion.

7. The method of claim 1, further including:
adding to the mixture a third dopant that adds deep level donors and/or acceptors to the middle of said band gap of said mixture when it is solidified.

8. The method of claim 7, wherein a concentration of the third dopant in the compound is between 10 and 10,000 atomic parts per billion.

9. The method of claim 7, wherein the third dopant is at least one element selected from the group consisting of V, Ti, Ni, Sn and Ge.

10. A radiation detector made from an compound comprising: $Cd_xZn_{1-x}Te$, where $0 \leq x \leq 1$; Pb in a concentration between 10 and 10,000 atomic parts per billion; and at least one element selected from the group consisting of (i) Cl and (ii) elements in column III of the periodic table in a concentration between 10 and 10,000 atomic parts per billion.

11. The radiation detector as set forth in claim 10, wherein the compound further includes at least one element selected from the group consisting of V, Ti, Ni, Sn and Ge in a concentration between 10 and 10,000 atomic parts per billion.

* * * * *